(12) United States Patent
Kim

(10) Patent No.: US 8,730,781 B2
(45) Date of Patent: May 20, 2014

(54) LIGHT DETECTING ELEMENT, AND OPTICAL PICK-UP DEVICE AND OPTICAL DISC DRIVE INCLUDING THE LIGHT DETECTING ELEMENT

(71) Applicant: Toshiba Samsung Storage Technology Korea Corporation, Suwon-si (KR)

(72) Inventor: Young-taek Kim, Seoul (KR)

(73) Assignee: Toshiba Samsung Storage Technology Korea Corporation, Suwon-si (KR)

( * ) Notice: Subject to any disclaimer, the term of this patent is extended or adjusted under 35 U.S.C. 154(b) by 0 days.

(21) Appl. No.: 13/973,065

(22) Filed: Aug. 22, 2013

(65) Prior Publication Data

US 2014/0056118 A1  Feb. 27, 2014

(30) Foreign Application Priority Data

Aug. 23, 2012  (KR) .......................... 10-2012-0092546

(51) Int. Cl.
*G11B 7/00* (2006.01)
(52) U.S. Cl.
USPC ........................................ 369/116; 369/53.27
(58) Field of Classification Search
None
See application file for complete search history.

(56) References Cited

U.S. PATENT DOCUMENTS

| | | | |
|---|---|---|---|
| 7,092,346 B2* | 8/2006 | Yamamoto | 369/116 |
| 7,522,487 B2* | 4/2009 | Kiji | 369/44.41 |
| 7,636,286 B2* | 12/2009 | Lee et al. | 369/53.26 |
| 2007/0086311 A1* | 4/2007 | Higashiyama et al. | 369/120 |
| 2011/0103213 A1 | 5/2011 | Erickson et al. | |

FOREIGN PATENT DOCUMENTS

| | | |
|---|---|---|
| JP | 2004-342278 | 12/2004 |
| JP | 2005-135528 | 5/2005 |
| JP | 2006-107733 | 4/2006 |
| JP | 2006-209874 | 8/2006 |
| JP | 2007-213649 | 8/2007 |
| JP | 2008-047246 | 2/2008 |

OTHER PUBLICATIONS

Korean Office Action issued Sep. 3, 2013 in counterpart Korean Patent Application No. 10-2012-0092546 (66 pages, in Korean).

* cited by examiner

*Primary Examiner* — Paul Huber
(74) *Attorney, Agent, or Firm* — NSIP Law

(57) ABSTRACT

Provided are a light detecting element, and an optical pick-up device and an optical disc drive including the light detecting element. The light detecting element includes a terminal resistance unit that is provided between an amplification unit and an output port to limit an electric current of the output signal.

16 Claims, 4 Drawing Sheets

LIGHT DETECTING ELEMENT, AND OPTICAL PICK-UP DEVICE AND OPTICAL DISC DRIVE INCLUDING THE LIGHT DETECTING ELEMENT

CROSS-REFERENCE TO RELATED PATENT APPLICATION(S)

This application claims the benefit under 35 USC §119(a) of Korean Patent Application No. 10-2012-0092546, filed on Aug. 23, 2012, in the Korean Intellectual Property Office, the entire disclosure of which is incorporated herein by reference for all purposes.

BACKGROUND

1. Field

The following description relates to a light detecting element that includes a terminal resistor, and an optical pick-up device and an optical disc drive including the same.

2. Description of Related Art

Front photo detectors (FPDs) are an example of optical light detecting elements that are used in an optical pick-up device that writes information to a disc and reads information from the disc. A typical light detecting element monitors optical power output from a laser diode (LD). The light detecting element typically includes a photo diode (PD) and an amplification device therein. The light detecting element may monitor output for power calibration and auto power control of a laser diode that is incident on a disc. A light detecting element is typically a semiconductor device in which a large number of components, such as a photo diode integrated chip (PDIC) or an amplification device, are integrated. The conventional light detecting element uses an external resistor to adjust a gain, in order to adjust a gain of an amplification unit installed therein. A variable resistor or a plurality of fixed resistance arrays are typically used as the external resistor.

In conventional optical pickups, a light detecting element is connected to an auto power control (APC) circuit through a flexible wiring member such as a flexible printed circuit board (FPCB). The wiring member includes a terminal resistor for matching electrical characteristics between the light detecting element and the APC circuit. When the terminal resistor is provided in the wiring member, the length of the wiring member may be increased, however, additional electrical noise may penetrate through the wiring member.

SUMMARY

In an aspect, there is provided a light detecting element including a body, a photo diode included in the body and configured to receive a beam from a laser diode of an optical pick-up device, an amplifier included in the body and comprising a plurality of amplifiers for differentially amplifying an output of the photo diode, an output port exposed to the outside of the body and configured to output the differential output signal from the amplifier to the outside, and a terminal resistor disposed between the amplifier and the output port and configured to control an electric current of the output signal.

The amplifier may output a first differential output signal and a second differential output signal, and the terminal resistor may comprise a first terminal resistor and a second terminal resistor that respectively correspond to the first differential output signal and the second differential output signal.

The light detecting element may further comprise a flexible printed circuit board (FPCB) wiring member on which the body is mounted.

The output port may be directly connected to an auto power control (APC) that controls an output of the laser diode, and the terminal resistor may control an amount of current received by the APC.

In an aspect, there is provided an optical pick-up apparatus including a light source that comprises a laser diode, and a light detecting element that monitors a beam from the laser diode, the light detecting element comprising a body, a photo diode included in the body and configured to receive a beam from the laser diode, an amplifier included in the body and comprising a plurality of amplifiers for differentially amplifying an output from the photo diode, an output port exposed to the outside of the body and configured to output the differential output signal from the amplifier to the outside, and a terminal resister disposed between the amplifier and the output port to control an electric current of the output signal.

The amplifier may output a first differential output signal and a second differential output signal, and the terminal resistor may comprise a first terminal resistor and a second terminal resistor that respectively correspond to the first differential output signal and the second differential output signal.

The optical pick-up apparatus may further comprise a flexible printed circuit board (FPCB) wiring member on which the body is mounted.

The output port may be directly connected to an auto power control (APC) that controls an output of the laser diode, and the terminal resistor may control an amount of current received by the APC.

The light source may comprise an optical structure corresponding to a compact disc (CD), a digital versatile disc (DVD), and a Blue-ray disc (BD).

The optical pick-up apparatus may further comprise a light transmission system that comprises an object lens for focusing light from the laser diode on an optical disc, wherein a beam splitter may be disposed between the light source and the light transmission system, and the light detecting element is provided on one side of the beam splitter to receive a part of a light beam from the light source as a monitor beam.

In an aspect, there is provided an optical disc drive including an optical pick-up device comprising a light source that comprises a laser diode, and a light detecting element that directly receives a beam from the laser diode, and a front end that is connected to the optical pick-up device and which comprises an auto power control (APC) that is connected to the light detecting element to control an output of the laser diode, wherein the light detecting element includes a body, a photo diode included in the body and configured to receive a beam from the laser diode, an amplifier included in the body and comprising a plurality of amplifiers for differentially amplifying an output from the photo diode, an output port exposed to the outside of the body and configured to output the differential output signal from the amplifier to the outside, and a terminal resistor that is disposed between the amplifier and the output port and configured to control an electric current of the output signal.

The amplifier may output a first differential output signal and a second differential output signal, and the terminal resistor may comprise a first terminal resistor and a second terminal resistor that respectively correspond to the first differential output signal and the second differential output signal.

The optical disc drive may further comprise a flexible printed circuit board (FPCB) wiring member on which the body is mounted.

The output port may be directly connected to an auto power control (APC) that controls an output of the laser diode, and the terminal resistor may control an amount of current received by the APC.

The light source may comprise an optical structure corresponding to a compact disc (CD), a digital versatile disc (DVD), and a Blue-ray disc (BD).

The optical disc drive may further comprise a light transmission system that comprises an object lens for focusing light from the laser diode on an optical disc, wherein a beam splitter may be disposed between the light source and the light transmission system, and the light detecting element is provided on one side of the beam splitter to receive a part of a light beam from the light source system as a monitor beam.

Other features and aspects may be apparent from the following detailed description, the drawings, and the claims.

Figure 1:
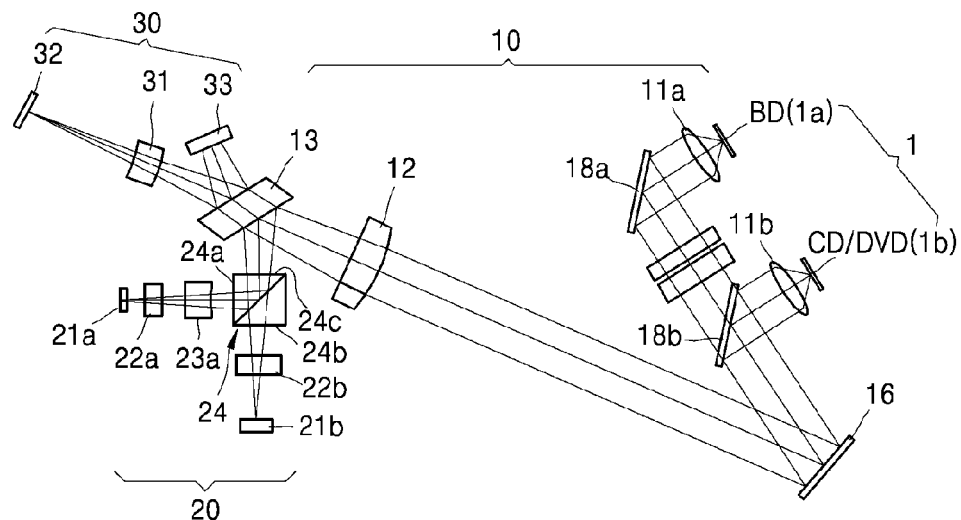
FIG. 1 is a diagram illustrating an example of an optical pick-up device.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

FIG. 1 illustrates an example of an optical pick-up device.

Referring to FIG. 1, optical pick-up device 2 includes a light transmission system 10 that corresponds to mediums 1, 1a, and 1b, a light source system 20 that provides a plurality of beams for reproducing and/or recording information from and/or to the medium 1, and a light reception system 30 that receives a beam reflected from the medium 1. For example, the light source system 20 may provide three beams including a main beam at a center of the light source system 20 and a first sub-beam and a second sub-beam at both ends thereof. In this example, the light source system 20, the light transmission system 10, and the light reception system 30 have an optical structure corresponding to a compact disc (CD), a digital versatile disc (DVD), and a Blue-ray disc (BD).

The light source system 20 includes a first light source 21a for a BD, a first diffraction element 22a for a BD, a coupling lens 23a, a second light source 21b for a CD/DVD, and a second diffraction element 22 for a CD/DVD, and a first beam splitter 24. The first beam splitter 24 has a cubic structure. A beam from the first light source 21a and a beam from the second light source 21b are incident on a first surface 24a and a second surface 24b that are adjacent to each other within the first beam splitter 24. In addition, the beams from the first and second light sources 21a and 21b are commonly emitted to a third surface 24c that faces the second surface 24b. Here, the beams are incident on a second beam splitter 13 which is further described. The coupling lens 23a adjusts an optical magnification, that is, an amount of defocusing of traveling light, between the first light source 21a and the second beam splitter 24 in order to adjust an optical distance between the first light source 21a and the mediums 1, 1a, and 1b.

The first and second diffraction elements 22a and 22b form single beams from the first and second light sources 21a and 21b into a main beam and ±primary sub-beams by a diffraction effect. The main beam and the ±primary sub-beams include a polarized light component (hereinafter, first polarized light) in a first direction and a polarized light component (hereinafter, second polarized light) in a direction that is perpendicular to the first direction. The first and second diffraction elements 22a and 22b may change an interval between the main beam and the sub-beam according to an interval between grids or frequencies.

The light transmission system 10 includes a light path refracting mirror 16 that refracts a path of light that is incident from the second beam splitter 13, a dichroic mirror 18b that is located on a traveling path of reflected light from the light path refracting mirror 16, and a total reflection mirror 18a that reflects the beam for a BD having passed through the dichroic mirror 18b. The dichroic mirror 18b reflects a beam having a specific wavelength from among incident beams, for example, a beam for a CD/DVD, and transmits a beam for a BD. A first object lens 11a for a BD is located on the traveling path of the reflected light of the total reflection mirror 18a, and a second object lens 11b for a CD/DVD is located on the traveling path of the reflected light from the dichroic mirror 18a.

The light reception system 30 includes a light-receiving element 32 that has three light-receiving cells receiving three beams reflected from the medium 1, a sensing lens 31 that focuses the three beams from the medium 1 on the light-receiving element 32 so as to have appropriate sizes, and a monitor beam detecting element 33 that receives a monitor beam from the light source system 20 and which may be referred to as a front photo detector (FPD). According to various aspects, the monitor beam light detecting element 33 is directly connected to an auto power control (APC) circuit of a front end portion of the optical disc drive. In this aspect, the light detecting element 33 and the APC are included in an optical detecting device.

Figure 2:
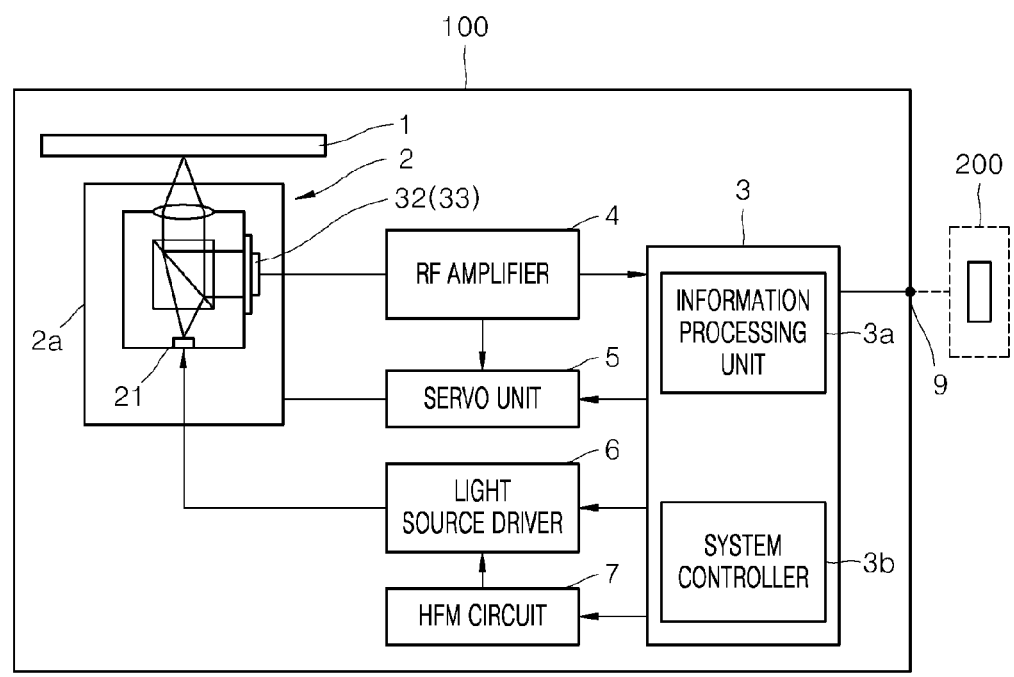
FIG. 2 is a diagram illustrating an example of an optical disc drive.

FIG. 2 illustrates an example of an optical disc drive including the optical pick-up device 2.

Referring to FIG. 2, optical disc drive 100 includes the optical pick-up device 2 that reads information from the medium 1 and writes information to the medium 1. The optical pick-up device 2 further includes an optical system as described with FIG. 1, and a mechanical system 2a that mechanically supports the optical system and causes a focusing operation and a tracking operation of an object lens. The light-receiving sensor 32 and the light detecting element 33 of the optical system are electrically connected to a front end portion (IC) 4 including a radio frequency (RF) amplifier, an APC, and the like.

In this example, a light source 21 is connected to a light source driver (or a laser diode driver (LDD)) 6. The light source driver 6 determines an electric current to be applied to the light source 21 on the basis of an output from the APC. The light source driver 6 is connected to an HFM circuit 7 that provides a high frequency modulation component. The mechanical system 2a of the optical pick-up device 2 is connected to a servo unit 5. Here, the servo unit 5 controls tracking, focusing, and the like of the optical pick-up device 2. The front end portion 4, the servo unit 5, the light source driver 6, and the HFM circuit 7 are connected to a DSP controller 3. The DSP controller 3 includes an information processing unit 3a that includes a decoder/encoder for processing a signal from the front end portion 4, and the like, and a system controller 3b that controls all components within a system such as the servo unit 5, the light source driver 6, or the HFM circuit 7.

Figure 3:
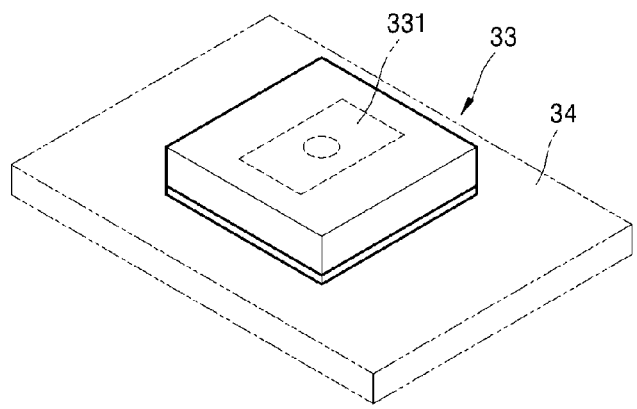
FIG. 3 is a diagram illustrating an example of a light detecting element.

FIG. 3 illustrates an example of the light detecting element 33. For example, the light detecting element 33 may be a front photo detector (FPD). The light detecting element 33 may monitor outputs of the first and second light sources 21a and 21b. The light detecting element 33 is small in size, and generally includes a body 330 (shown in FIG. 4) having a cubic shape which has four side surfaces. In addition, the light detecting element 33 includes a photo diode 331 and an amplification unit 333 for amplifying a signal from the photo diode 331. These features may be implemented as an integrated circuit (IC) element that is installed in a wiring member 34, such as an FPCB, by a solder ball provided on the bottom thereof.

Figure 4:
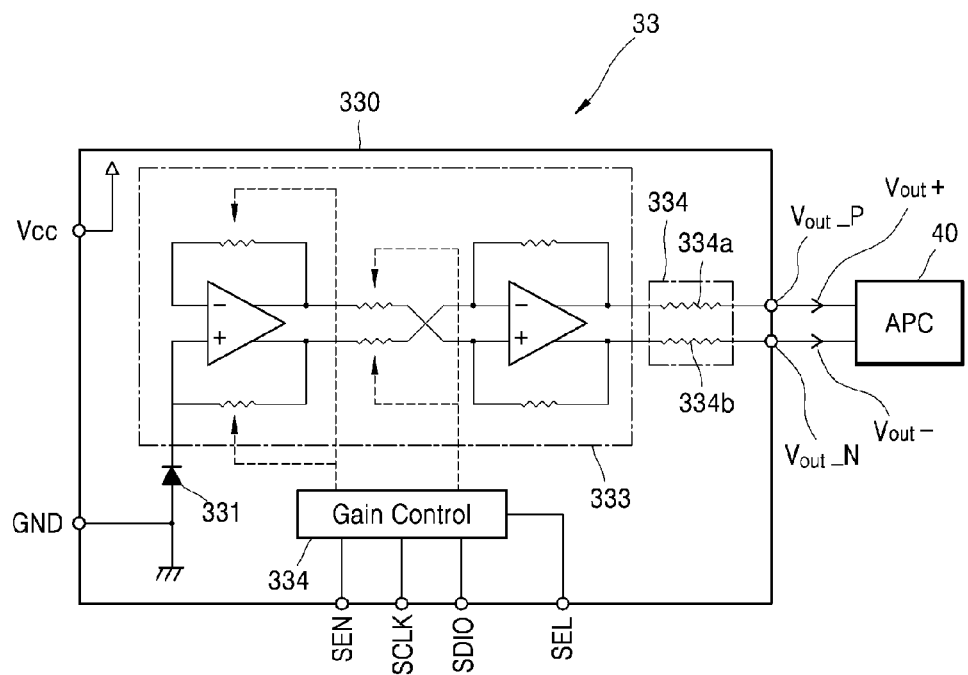
FIG. 4 is an example of a circuit diagram of the light detecting element of FIG. 3.

FIG. 4 illustrates an example of a circuit diagram of the three wavelength light detecting element 33. The body 330 of the light detecting element 33 includes the photo diode 331, the amplification unit 333 that has a plurality of operation amplifiers, and a gain control unit 334 that controls a gain. As illustrated in FIG. 4, one side of the body 330 includes a driving voltage port (Vcc) for applying a voltage to the amplification unit 333 and the gain control unit 334, a ground port GND for providing a ground path to the amplification unit 333, a serial enable SEN, a serial clock SCLK, a serial data input/output port SDIO, a serial enable (signal) input port SEL, a P-type differential output port VOUT_P for outputting a first differential signal (Vout+ or FPD+), and a N-type differential output port Vout_N for outputting a second differential signal (Vout- or FPD-).

According to various aspects, the body 330 includes a terminal resistance unit 334 including a first terminal resistor 334a and a second terminal resistor 334b which are disposed between the amplification unit 333 and the P-type and N-type differential output ports VOUT_P and VOUT_N. According to various aspects, the first and second terminal resistors 334a and 334b are installed within the body 330 of the light detecting element 33. Thus, the P-type and N-type differential output ports VOUT_P and VOUT_N of the light detecting element 33 are directly connected to an APC 40 through the wiring member 34, and a terminal resistor for limiting an electric current is not included between the P-type and N-type differential output ports VOUT_P and VOUT_N and the APC 40.

Figure 5:
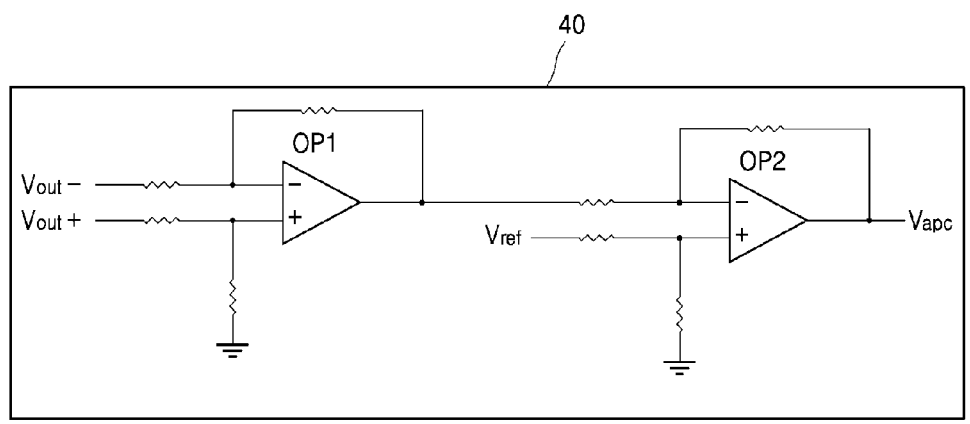
FIG. 5 is an example of a circuit diagram of an auto power controller (APC) that is connected to a light detecting element.

FIG. 5 illustrates an example of a circuit diagram of the APC 40 to which the first and second differential signals (outputs) are applied. In the APC 40, a first operation amplifier OP1 operates (amplifies) a difference (Vout+-Vout-) between the first and second differential signals, and a second operation amplifier OP2 amplifies a difference between an output of the first operation amplifier OP1 and a APC reference voltage Vref to provide a control voltage Vapc to the light source driver 6. For example, when the difference between the first and second differential signals, that is, Vout+-Vout-, is less than the APC reference voltage Vref, the APC 40 may increase the control voltage Vapc to increase optical power (electric current) of a laser diode. As another example, when the difference is equal to or greater than the APC reference voltage Vref, the APC 40 may decrease the control voltage Vapc to decrease the optical power of the laser diode.

Figure 6:
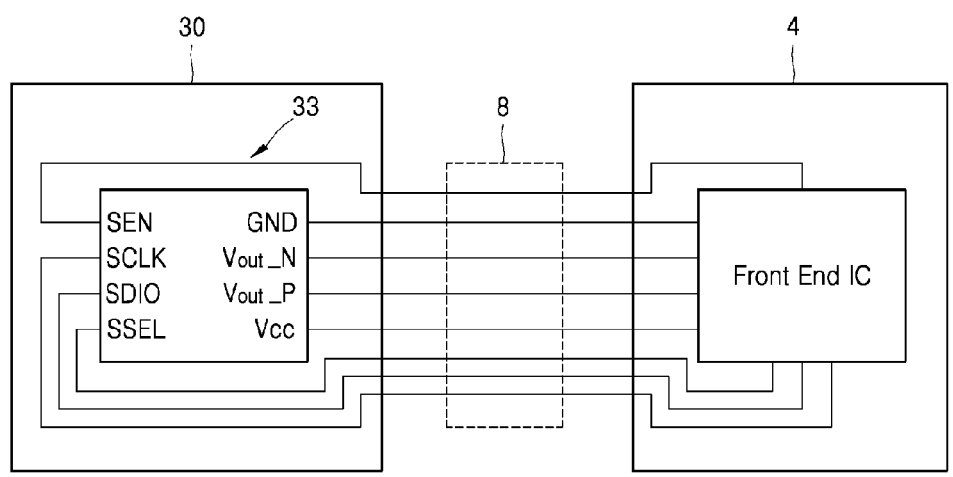
FIG. 6 is a diagram illustrating an example of a connection between the light detecting element and a front end portion of the optical pick-up device.

FIG. 6 illustrates an example in which the light detecting element 33 and the front end portion 4 are directly connected to each other through a cable 8. As illustrated in FIG. 6, a passive element, such as a terminal resistor that is present in the related art, is not present between the light detecting element 33 and the front end portion 4. This structure is possible because a terminal resistor is installed within the light detecting element 33.

The first and second terminal resistors 334a and 334b that are installed in the light detecting element 33 equalize (optimize) waveforms of the first and second differential signals Vout+ and Vout-, and control an electric current, thereby preventing the APC 40 from being destroyed or otherwise damaged due to an excessive electric current. In contrast, when the first and second terminal resistors 334a and 334b are not present, the APC 40 may be damaged when voltages of the first and second differential signals Vout+ and Vout- change. For example, signals may be distorted because impedances of the amplification unit 333 and the APC 40 are not matched with each other.

Figure 7:
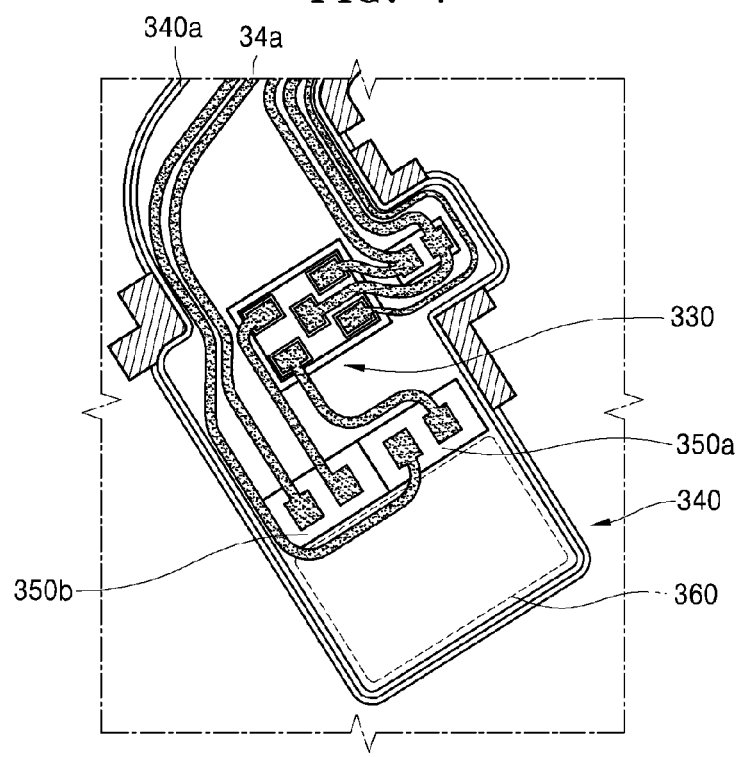
FIG. 7 is a diagram illustrating an example of a pattern of a wiring layer of a wiring member according to a related art.
Figure 8:
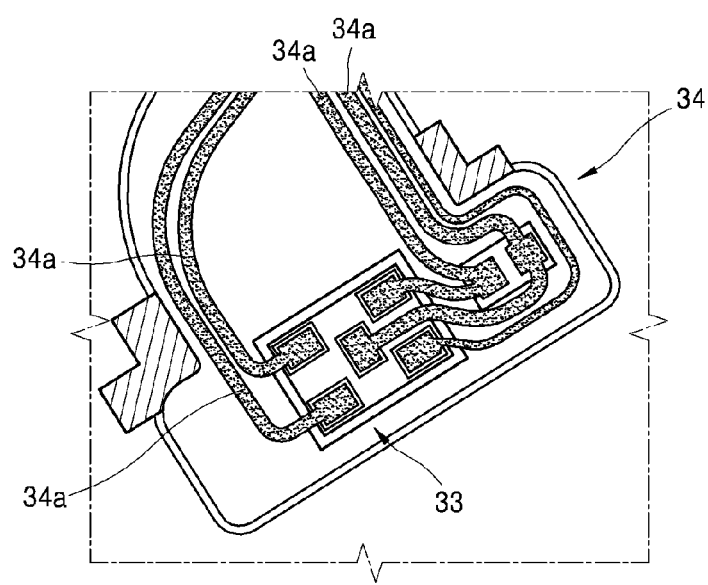
FIG. 8 is a diagram illustrating an example of a pattern of a wiring layer of a wiring member according to various aspects.

In the related art, as illustrated in FIG. 7, terminal resistors 350a and 350b and a separate FPCB 360 for preventing an electrical short circuit from occurring between the terminal resistors 350a and 350b are disposed on the FPCB-type wiring member 340.

In the related art, a unique resistance value of a long wiring layer 340a of an FPCB is required to be applied when determining a resistance value of a terminal resistor. However, the length of the FPCB of each product may vary, and thus the terminal resistors 350a and 350b of each product typically require different resistance values. When a resistance value of a terminal resistor is determined with respect to a specific light detecting element and APC, if the length of a wiring member varies, the resistance value needs to be corrected in response to a variation in the length of the wiring member. Such a unique resistance value increases as the length of the wiring member increases. The increase in the length of the wiring member results in an inflow of noise through the wiring member and an unstable operation of the APC due to the inflow of noise. Accordingly, it is preferable to minimize the length of the wiring member, and dispose the terminal resistor so as not to be influenced by a specific resistance of a cable.

Various aspects herein resolve the above-described problems by installing a terminal resistor in a light detecting element. For example, the terminal resistor is installed in the light detecting element 33, and thus the lengths of wiring lines 34a of the wiring member 34 are minimized, thereby decreasing a specific resistance of a cable. In addition, the terminal resistor is disposed irrespective of the cable, and thus a resistance value of the terminal resistor may be determined as one fixed value within a predetermined error range according to the distribution of characteristics between products with respect to all products.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A light detecting element comprising:
   a body;
   a photo diode included in the body and configured to receive a beam from a laser diode of an optical pick-up device;
   an amplifier included in the body and comprising a plurality of amplifiers for differentially amplifying an output of the photo diode;
   an output port exposed to the outside of the body and configured to output the differential output signal from the amplifier to the outside; and
   a terminal resistor disposed between the amplifier and the output port and configured to control an electric current of the output signal.

2. The light detecting element of claim 1, wherein the amplifier outputs a first differential output signal and a second differential output signal, and the terminal resistor comprises a first terminal resistor and a second terminal resistor that respectively correspond to the first differential output signal and the second differential output signal.

3. The light detecting element of claim 1, further comprising a flexible printed circuit board (FPCB) wiring member on which the body is mounted.

4. The light detecting element of claim 1, wherein the output port is directly connected to an auto power control (APC) that controls an output of the laser diode, and the terminal resistor controls an amount of current received by the APC.

5. An optical pick-up apparatus comprising:
   a light source that comprises a laser diode; and
   a light detecting element that monitors a beam from the laser diode, the light detecting element comprising:
      a body;
      a photo diode included in the body and configured to receive a beam from the laser diode;
      an amplifier included in the body and comprising a plurality of amplifiers for differentially amplifying an output from the photo diode;
      an output port exposed to the outside of the body and configured to output the differential output signal from the amplifier to the outside; and
      a terminal resister disposed between the amplifier and the output port to control an electric current of the output signal.

6. The optical pick-up apparatus of claim 5, wherein the amplifier outputs a first differential output signal and a second differential output signal, and the terminal resistor comprises a first terminal resistor and a second terminal resistor that respectively correspond to the first differential output signal and the second differential output signal.

7. The optical pick-up apparatus of claim 5, further comprising a flexible printed circuit board (FPCB) wiring member on which the body is mounted.

8. The optical pickup apparatus of claim 5, wherein the output port is directly connected to an auto power control (APC) that controls an output of the laser diode, and the terminal resistor controls an amount of current received by the APC.

9. The optical pick-up apparatus of claim 5, wherein the light source comprises an optical structure corresponding to a compact disc (CD), a digital versatile disc (DVD), and a Blue-ray disc (BD).

10. The optical pick-up apparatus of claim 5, further comprising a light transmission system that comprises an object lens for focusing light from the laser diode on an optical disc,
    wherein a beam splitter is disposed between the light source and the light transmission system, and the light detecting element is provided on one side of the beam splitter to receive a part of a light beam from the light source as a monitor beam.

11. An optical disc drive comprising:
    an optical pick-up device comprising a light source that comprises a laser diode, and a light detecting element that directly receives a beam from the laser diode; and
    a front end that is connected to the optical pick-up device and which comprises an auto power control (APC) that is connected to the light detecting element to control an output of the laser diode,
    wherein the light detecting element comprises:
       a body;
       a photo diode included in the body and configured to receive a beam from the laser diode;
       an amplifier included in the body and comprising a plurality of amplifiers for differentially amplifying an output from the photo diode;
       an output port exposed to the outside of the body and configured to output the differential output signal from the amplifier to the outside; and
       a terminal resistor that is disposed between the amplifier and the output port and configured to control an electric current of the output signal.

12. The optical disc drive of claim 11, wherein the amplifier outputs a first differential output signal and a second differential output signal, and the terminal resistor comprises a first terminal resistor and a second terminal resistor that respectively correspond to the first differential output signal and the second differential output signal.

13. The optical disc drive of claim 11, further comprising a flexible printed circuit board (FPCB) wiring member on which the body is mounted.

14. The optical disc drive of claim 11, wherein the output port is directly connected to an auto power control (APC) that controls an output of the laser diode, and the terminal resistor controls an amount of current received by the APC.

15. The optical disc drive of claim 11, wherein the light source comprises an optical structure corresponding to a compact disc (CD), a digital versatile disc (DVD), and a Blue-ray disc (BD).

16. The optical disc drive of claim 11, further comprising a light transmission system that comprises an object lens for focusing light from the laser diode on an optical disc,
    wherein a beam splitter is disposed between the light source and the light transmission system, and the light detecting element is provided on one side of the beam splitter to receive a part of a light beam from the light source system as a monitor beam.

* * * * *